(12) United States Patent
Golov

(10) Patent No.: US 11,762,724 B2
(45) Date of Patent: *Sep. 19, 2023

(54) AUTOMOTIVE ELECTRONIC CONTROL UNIT RELIABILITY AND SAFETY DURING POWER STANDBY MODE

(71) Applicant: Micron Technology, Inc., Boise, ID (US)

(72) Inventor: Gil Golov, Backnang (DE)

(*) Notice: Subject to any disclaimer, the term of this patent is extended or adjusted under 35 U.S.C. 154(b) by 0 days.

This patent is subject to a terminal disclaimer.

(21) Appl. No.: 17/460,118

(22) Filed: Aug. 27, 2021

(65) Prior Publication Data

US 2021/0390009 A1    Dec. 16, 2021

Related U.S. Application Data

(63) Continuation of application No. 16/374,294, filed on Apr. 3, 2019, now Pat. No. 11,106,519.

(51) Int. Cl.
| | | |
|---|---|---|
| *G06F 11/07* | (2006.01) | |
| *B60R 16/023* | (2006.01) | |
| *G11C 11/4074* | (2006.01) | |
| *G11C 5/14* | (2006.01) | |
| *B60R 16/03* | (2006.01) | |

(52) U.S. Cl.
CPC ........ *G06F 11/076* (2013.01); *B60R 16/0231* (2013.01); *B60R 16/03* (2013.01); *G11C 5/148* (2013.01); *G11C 11/4074* (2013.01)

(58) Field of Classification Search
CPC ............... G06F 11/076; G06F 11/1048; G06F 11/1004; G06F 11/1044; B60R 16/0231; B60R 16/03; G11C 5/148; G11C 11/4074; G11C 2029/0409; G11C 2029/0411; G11C 29/44; G11C 29/52; G11C 2207/2227; G11C 29/04; G11C 11/4078; G11C 29/42

See application file for complete search history.

(56) References Cited

U.S. PATENT DOCUMENTS

| | | |
|---|---|---|
| 10,223,224 B1 | 3/2019 | Hickey et al. |
| 11,106,519 B2 | 8/2021 | Golov |
| 2005/0235127 A1 | 10/2005 | Muthiah et al. |

(Continued)

OTHER PUBLICATIONS

Y. Cai, S. Ghose, E. F. Haratsch, Y. Luo and O. Mutlu, "Error Characterization, Mitigation, and Recovery in Flash-Memory-Based Solid-State Drives," in Proceedings of the IEEE, vol. 105, No. 9, pp. 1666-1704, Sep. 2017, doi: 10.1109/JPROC.2017.2713127. (Year: 2017).*

(Continued)

*Primary Examiner* — Daniel F. McMahon
(74) *Attorney, Agent, or Firm* — Greenberg Traurig

(57) ABSTRACT

Disclosed are devices and methods for improved operations of a memory device. In one embodiment, a method is disclosed comprising periodically recording memory statistics of a dynamic random-access memory in a device, while the device is in a power on state; detecting a command to enter a standby state; analyzing the memory statistics to determine whether a health check should be performed; powering down the device when determining that the health check should be performed; and placing the device in standby mode when determining that the health check should not be performed.

23 Claims, 5 Drawing Sheets

(56) References Cited

U.S. PATENT DOCUMENTS

2008/0034148 A1    2/2008   Gower et al.
2013/0124932 A1    5/2013   Schuh et al.
2013/0212440 A1    8/2013   Rom et al.
2020/0319949 A1   10/2020   Golov

OTHER PUBLICATIONS

Meza, "Large Scale Studies of Memory, Storage, and Network Failures in a Modern Data Center", Dec. 2018, Carnegie Mellon University (Year: 2018).*
Park, et al. "Power management of hybrid DRAM/PRAM-based main memory," 48th ACM/EDAC/IEEE Design Automation Conference (DAC), 2011.

* cited by examiner

AUTOMOTIVE ELECTRONIC CONTROL UNIT RELIABILITY AND SAFETY DURING POWER STANDBY MODE

CROSS-REFERENCE TO RELATED APPLICATIONS

This application is a continuation application of and claims priority to U.S. patent application Ser. No. 16/374,294, filed Apr. 3, 2019, issued as U.S. Pat. No. 11,106,519 on Aug. 31, 2021, the entire disclosure of which application is hereby incorporated herein by reference.

COPYRIGHT NOTICE

This application includes material that is subject to copyright protection. The copyright owner has no objection to the facsimile reproduction by anyone of the patent disclosure, as it appears in the Patent and Trademark Office files or records, but otherwise reserves all copyright rights whatsoever.

BACKGROUND

The disclosed embodiments are directed toward in-vehicle computing systems and, in particular, to devices and methods for improving the operation of dynamic random-access memory (DRAM) in electronic control units (ECUs) of a vehicle.

A modern car contains dozen of ECUs. These ECUs can be used for infotainment systems or may be used as critical systems such as in autonomous vehicles. To reduce startup times, one or more of these ECUs are never fully switched off when a vehicle is powered off. Rather, such ECUs are placed in "standby" mode (also known as "self-refresh" mode). When in standby mode, the state of the ECU is placed in DRAM and other components are selectively shutdown. The power to DRAM is maintained and the DRAM is periodically refreshed during this time. When powering up from standby mode, the powered off components are restarted and the state in DRAM is used as the current state, thus enabling the system to be "started" in the same state it was "powered off" in.

While standby mode allows for rapid turn on times (since the configured state is already in DRAM and configured), it results in error propagation due to the "freezing" of state in DRAM. Specifically, during operation, DRAM data can include errors (hard or soft) caused by the running software or by inherent physical side effects of the underlying DRAM cells. Some of these errors can be remedied by error correction code (ECC) processing installed within DRAM devices, but even the presence of many corrected errors indicates a potential problem with the device. Additionally, memory leakage of long-running software is exacerbated by the state-saving nature of standby mode.

The disclosed embodiments remedy these and other technical problems by providing methods and devices for checking the health of a DRAM device prior to entering standby mode.

BRIEF DESCRIPTION OF THE FIGURES

The preceding and other objects, features, and advantages of the disclosure will be apparent from the following description of embodiments as illustrated in the accompanying drawings, in which reference characters refer to the same parts throughout the various views. The drawings are not necessarily to scale, emphasis instead being placed upon illustrating principles of the disclosure.

DETAILED DESCRIPTION

The disclosed embodiments describe systems, devices, methods, and computer-readable media for improving the reliability of standby mode employed by ECUs. During operation, the embodiments monitor the number of corrected (or uncorrected) errors as well as the number of potential memory leaks. In response to a standby command, the embodiments determine if the number of errors is below a threshold and if no memory leaks are present. If true, the embodiments enter standby; but, if false, the embodiments perform a full power down and restart to standby. In this manner, DRAM state is periodically refreshed with a full power down when in a potentially corrupted state, ensuring proper operation of the system during restart.

One embodiment of a method is disclosed comprising periodically recording memory statistics of a dynamic random-access memory in a device (i.e., the number of ECC-corrected errors, uncorrected errors, or memory leaks), while the device is in a power on state; detecting a command to enter a standby state; analyzing the memory statistics to determine whether a health check should be performed; powering down the device when determining that a health check should be performed; and placing the device in standby mode when determining that a health check should not be performed.

Figure 1:
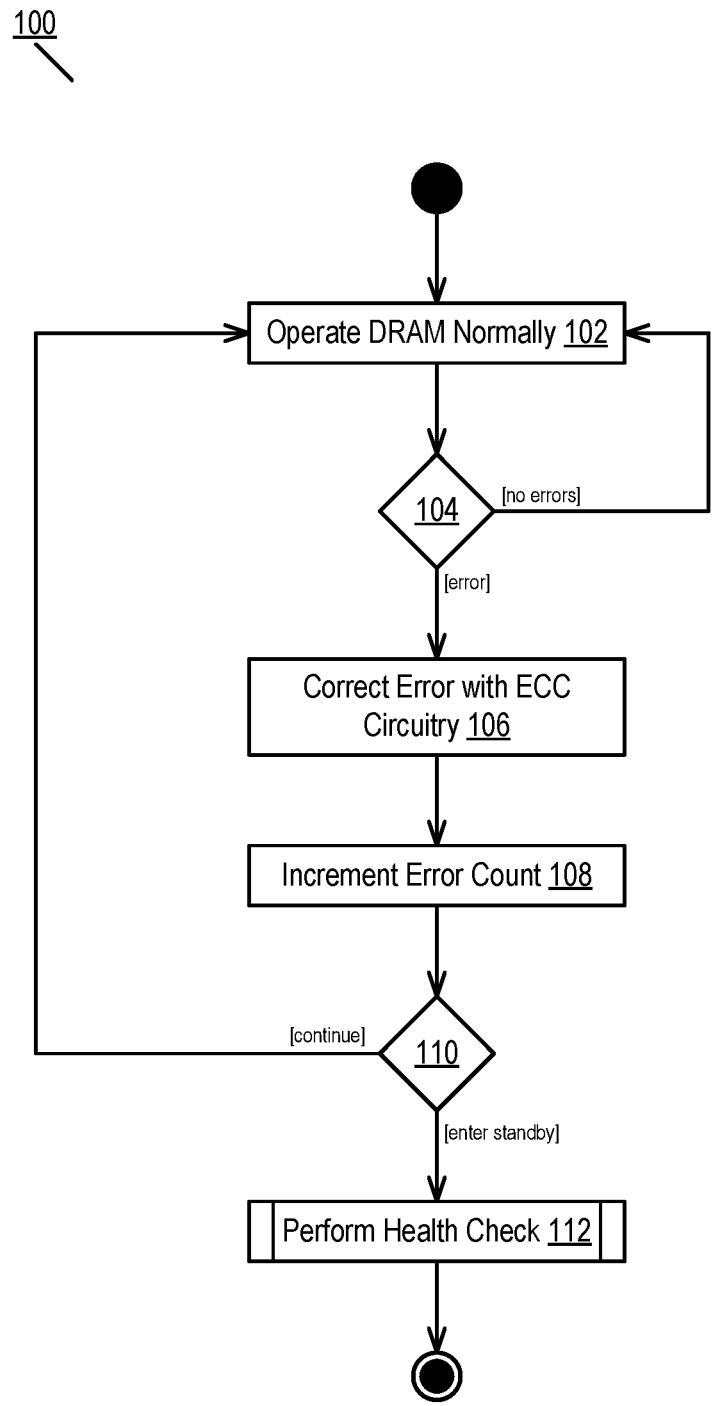
FIG. 1 is a flow diagram illustrating a method for monitoring errors in a DRAM device according to some embodiments of the disclosure.

FIG. 1 is a flow diagram illustrating a method for monitoring errors in a DRAM device according to some embodiments of the disclosure.

In block 102, a DRAM device is operated normally. During normal operations data is read and written from DRAM by an operating system and other hardware. During read operations, all data is error-checked using an ECC decoder to confirm that no errors occur. During write operations, the DRAM encodes user data using an ECC encoder to generate one or more parity bits that are stored in DRAM along with the user data.

In block 104, the method (100) checks for errors in the DRAM and, in block 106, the method (100) corrects the error with ECC circuitry.

In some embodiments, the method (100) performs block 104 as part of a read operation. During a read operation user data and corresponding parity data is retrieved from the DRAM cells. In some embodiments, the DRAM uses syndrome decoding to detect and, if possible, correct any errors in the returned user data/parity data. Upon correction, the DRAM returns the user data responsive to the read request. Specific details regarding the operation of ECC in DRAM operations is not presented in detail herein and any permutation of ECC in a DRAM (or other storage device) may be used.

In block 108, the method (100) increments an error count in response to detecting an error in the DRAM memory.

During operation, a DRAM device can set a bit flag indicating the presence of an error detected during operation. In some devices, this flag comprises an error status bit stored within a specific register of the controller of the DRAM. In some embodiments, the DRAM device may also record the error to an internal error log. In either scenario, the presence of an error can be detected by an operating system by reading out the contents of the register and/or error log.

In the illustrated embodiment, the method (100) maintains a running tally of errors encountered by the DRAM. This tally of errors can be stored in persistent storage such as Flash storage. In some embodiments, the tally itself may be stored within DRAM. In the former, the tally is reset when the operating system performs a system restart. In the latter, the tally is reset automatically when the DRAM is powered off but remains if the DRAM is suspended in standby mode. In some embodiments, the tally may be recorded in DRAM for a given power cycle of the DRAM and simultaneously stored for long term storage in non-volatile storage. In this manner, historical error counts of the DRAM can be maintained while simultaneously maintaining a current session error count.

In some embodiments, the method (100) stores a single integer representing the number of errors. In block 108, this integer is incremented each time an error is detected (e.g., via the DRAM register and/or log file). In other embodiments, additional data can be stored. For instance, the method (100) may store details regarding the command causing the error (e.g., a read/write address, data to be written, timestamp, etc.). This data may be extracted from the DRAM log file. In these expanded embodiments, the tally can then be synthesized by totaling the number of entries (or by maintaining a separate single-integer tally).

In block 110, after incrementing the error count, the method (100) determines if standby mode should be entered.

In the illustrated embodiment, standby mode can be entered by an operating system requesting that the DRAM enter standby mode. In general, standby mode in a vehicle is entered when the user of a vehicle powers off the ignition. If the method (100) determines that standby mode has not been triggered, the method (100) continues to operate the DRAM normally (block 102) and repeats the error-processing routine (blocks 104, 106, 108) until standby mode is entered (block 110).

In block 112, the method (100) performs a health check on the DRAM upon determining that the device is being instructed to enter standby mode. Further detail regarding the performing of a health check in block 112 is described in more detail in FIG. 3.

Figure 2:
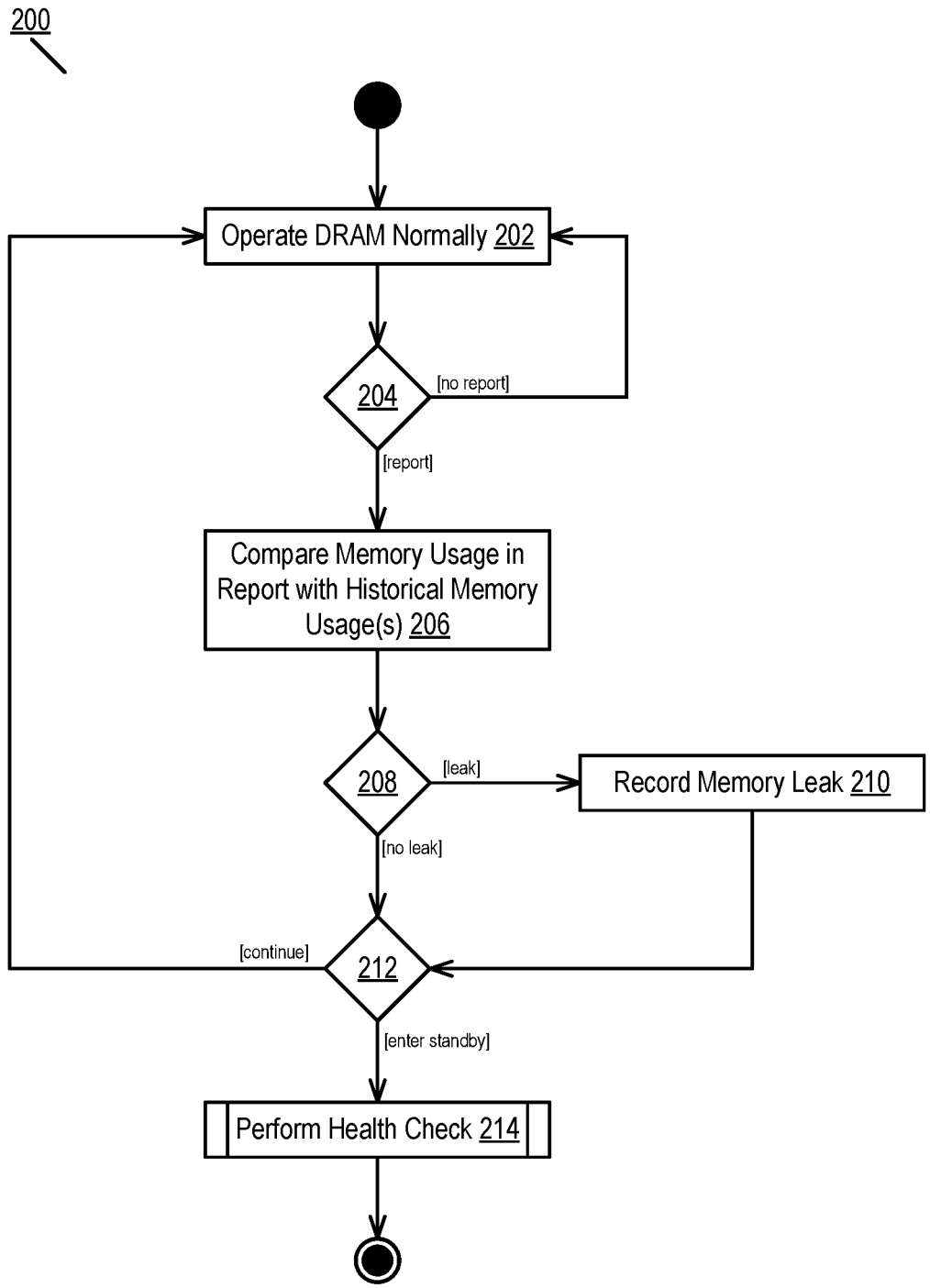
FIG. 2 is a flow diagram illustrating a method for monitoring memory leaks in a DRAM device according to some embodiments of the disclosure.

FIG. 2 is a flow diagram illustrating a method for monitoring memory leaks in a DRAM device according to some embodiments of the disclosure.

In block 202, a DRAM device is operated normally. During normal operations data is read and written from DRAM by an operating system and other hardware. During read operations, all data is error-checked using an ECC decoder to confirm that no errors occur. During write operations, the DRAM encodes user data using an ECC encoder to generate one or more parity bits that are stored in DRAM along with the user data. While illustrated as an initial block, in some embodiments, block 202 is optional in the method (200).

In block 204, the method (200) determines if a memory report was received.

In the illustrated embodiment, a memory report refers to a listing of active processes in DRAM and the amount of memory used by those processes. In general, an operating system maintains a list of processes currently executing and various statistics regarding those processes. Examples of such statistics include physical memory used by the process, virtual memory used by the process, swap size used by the process, code size, page fault counts, and various other statistics.

In one embodiment, the method (200) executes block 204 periodically while the DRAM is operating normally (i.e., when the device housing the DRAM is powered on). For example, the method (200) can sample memory usage via the report every 30 seconds or every 10 minutes. The specific interval is not intended to be limiting.

In block 206, the method (200) compares the memory usage in the report with historical memory usages of identical processes.

In the illustrated embodiment, each process in the report has a command or program name which identifies the process. Processes also have unique process identifiers however these vary based on when the process is launched. Thus, for purposes described herein, the command or program name (referred to as the "name" of a process) are used as the basis of comparison. In some embodiments, multiple processes having the same name may be present. In these embodiments, the method (200) may aggregate the memory statistics of these processes into a single process.

An exemplary memory report may appear as follows:

| PID | COMMAND | VIRT | RES | SHR |
| --- | --- | --- | --- | --- |
| 1 | watchman | 402560 | 30008 | 16752 |
| 2 | display | 630132 | 27972 | 21556 |
| 3 | networker | 459968 | 23320 | 18676 |

In Table 1, "VIRT" refers to the amount of virtual memory used by a "COMMAND" with process identifier "PID." "RES" refers to reserved memory for the same process (i.e., the code of the process and any data used by the process); and "SHR" refers to the amount of shared memory used by the process. Various other fields may be present in the report.

As discussed, these reports may be received on a periodic basis and, in some embodiments, are cached by the method (200) for comparison. For instance, the most recent five reports may be cached in a database or similar structure for comparison.

In block 206, the method (200) compares an instant report with one or more past reports to determine if the amount of memory used by a given process name is increasing. Various thresholds may be used to determine the number of reports an increase must be detected in before a memory leak is identified. For instance, the method (200) may require that three previous reports must have consecutively lower memory values for a given process before a memory leak is predicted. Thus, in Table 1, if "watchman" has a current RES value of 30008 and four sequential, previous values of 30000, 29000, 28000, and 27000, the method (200) determines that a memory leak likely exists. Conversely, if the four sequential previous values are 30000, 31000, 29000, 30500, the method (200) can conclude that the process is operating within a normal range of memory usage.

In some embodiments, the method (200) only analyzes the reserved memory used by the process. That is, the memory dedicated to the process code and the data used. In other embodiments, the method (200) uses other memory measures such as virtual memory used or shared memory used. In yet another embodiment, the method (200) may total one or more of these memory measurements and use the total memory as the comparison value.

In another embodiment, the method (200) may analyze the variance between memory fluctuations over time when classifying a process as having a memory leak. For instance, by analyzing the past reports, the method (200) can calculate the standard deviation from the mean memory usage. This standard deviation may be revised over time based on new reports. In this embodiment, the method (200) may compare the deviation of a current reports indication of memory usage to the standard deviation and if the current memory usage deviates by more than a standard deviation, the method (200) flags the process as containing a memory leak.

In block 208, the method (200) uses the determination (206) to determine if a leak has occurred. As described above, the method (200) makes this determination by comparing the current memory usage of processes with previous memory usages of processes.

In block 210, the method (200) records a memory leak upon determining that a memory leak has likely occurred in blocks 206 and 208.

In one embodiment, the method (200) may increment a tally of memory leaks detected in blocks 206 and 208. This tally of errors can be stored in persistent storage such as Flash storage. In some embodiments, the tally itself may be stored within DRAM. In the former, the tally is reset when the operating system performs a system restart. In the latter, the tally is reset automatically when the DRAM is powered off but remains if the DRAM is suspended in standby mode. In some embodiments, the tally may be recorded in DRAM for a given power cycle of the DRAM and simultaneously stored for long term storage in non-volatile storage. In this manner, historical memory leak counts of the DRAM can be maintained while simultaneously maintaining a current memory leak count.

In some embodiments, the method (200) stores a single integer representing the number of memory leaks. In block 210, this integer is incremented each time a memory leak is detected (blocks 206 and 208). In other embodiments, additional data can be stored. For instance, the method (200) may store details regarding the program causing the leak, the memory utilization thereof, etc. In these expanded embodiments, the tally can then be synthesized by totaling the number of entries (or by maintaining a separate single-integer tally).

Alternatively, or in conjunction with the foregoing, the method (200) can store a probability of a leak occurring in addition to incrementing a leak count. For example, if the memory usage is increasing one byte over the last four periods, the method (200) can assign a low likelihood of a memory leak being present to the leak. Alternatively, if the memory increase is more significant, the probability can be increased.

In block 212, after recording a memory leak (210) or determining no leak exists (208), the method (200) determines if standby mode should be entered.

In the illustrated embodiment, standby mode can be entered by an operating system requesting that the DRAM enter standby mode. In general, standby mode in a vehicle is entered when the user of a vehicle powers off the ignition. If the method (200) determines that standby mode has not been triggered, the method (200) continues to operate the DRAM normally (block 202) and repeats the leak-processing routine (blocks 204, 206, 208, 210) until standby mode is entered (block 212).

In block 214, the method (200) performs a health check on the DRAM upon determining that the device is being instructed to enter standby mode. Further detail regarding the performing of a health check in block 214 is described in more detail in FIG. 3.

While the methods (100, 200) are illustrated separately, they may be executed in parallel by an operating system of an ECU. Thus, in some embodiments, two tallies of errors and memory leaks are maintained by the system executing the methods (100, 200).

Figure 3:
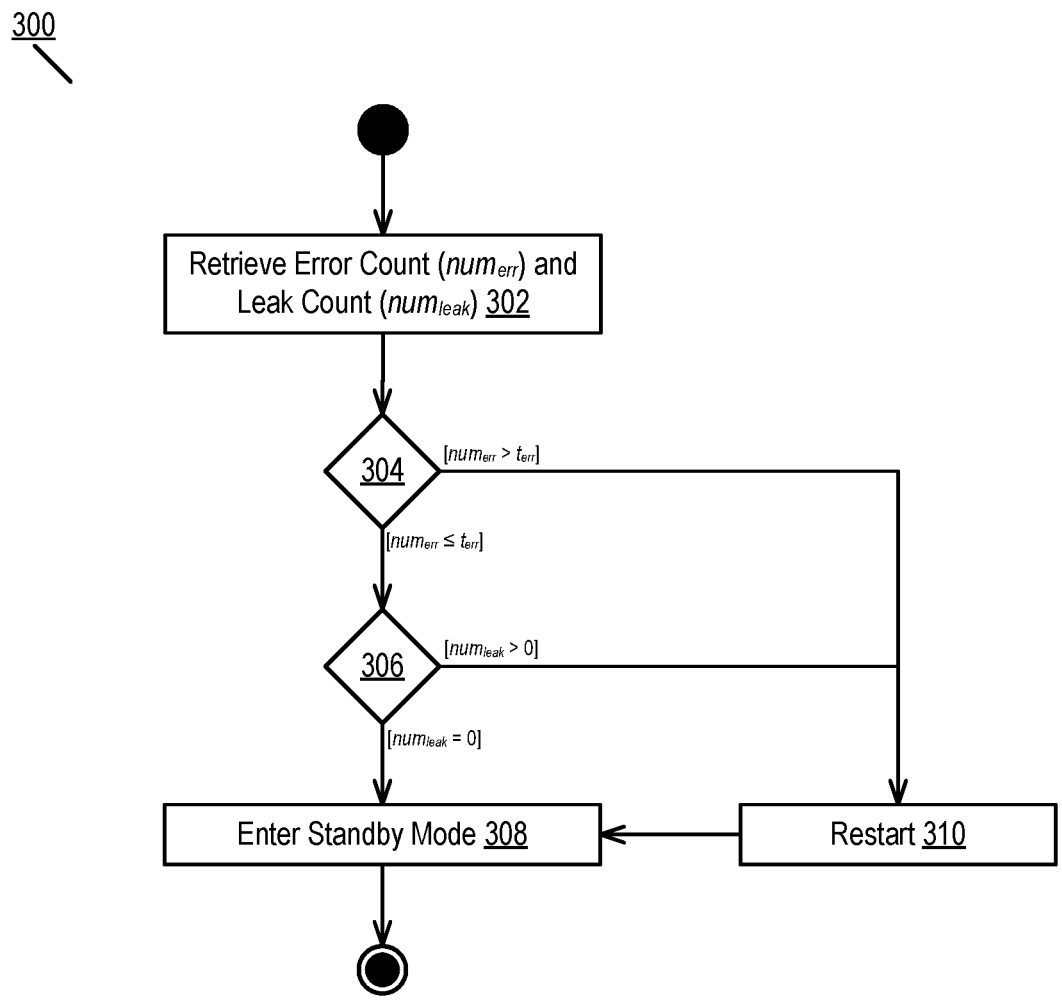
FIG. 3 is a flow diagram illustrating a method for performing a health check of a DRAM device before entering a standby mode according to some embodiments of the disclosure.

FIG. 3 is a flow diagram illustrating a method for performing a health check of a DRAM device before entering a standby mode according to some embodiments of the disclosure.

As discussed previously, the illustrated method (300) is executed in response to a request for a device (including DRAM) to enter standby mode. In one embodiment, the method (300) and methods (100, 200) are executed by an operating system of an ECU. Thus, when the operating system of an ECU receives a standby command, the operating system executes the method (300) prior to going into standby mode. In this manner, the operating system of an ECU is modified to perform the methods (100, 200, 300).

In block 302, the method (300) retrieves an error count and leak count.

As described above, the error count and leak count may comprise integer values stored on non-volatile storage or in DRAM. Alternatively, the error data and leak data may be aggregated by the method (300) to determine a final error count and leak count. Specific details on the storage or aggregation of this data is described in the descriptions of FIGS. 1 and 2 and is not repeated herein.

In block 304, the method (300) determines if the error count is above a pre-configured error threshold.

In the illustrated embodiment, the number of errors is an integer value. In the illustrated embodiment, the pre-configured error threshold comprises a fixed integer value of errors allowable. Thus, if the pre-configured error threshold is four and the error count is five, the method (300) proceeds to block 310. Likewise, if the error count is three, the method (300) proceeds to block 306.

In other embodiments, the pre-configured error threshold can comprise a dynamic value. In this scenario, the threshold may be adjusted based on a variety of factors. In one example, the pre-configured error threshold can be changed based on the uptime of the DRAM in each power cycle. That is, as the DRAM is powered or in standby, the pre-configured error threshold is linearly (or otherwise) increased. As another example, the pre-configured error threshold can be increased based on the throughput of the DRAM. In this scenario, more frequent reads or writes to the DRAM increases the chances of errors and thus the pre-configured error threshold is adjusted upward accordingly. As another example, the pre-configured error threshold can be increase based on the age of the DRAM. In this example, an older DRAM may be more susceptible to errors and thus may correct more errors than a newer DRAM. The age of a DRAM can be computed based on the first boot of the DRAM recognized by the operating system or may be hardcoded into the DRAM controller's settings. As another example, the pre-configured error threshold may be pre-configured in the settings of the DRAM controller by the manufacturer. In this example, the DRAM manufacture sets the expected number of errors over a given period and the operating system uses this value to calculate the pre-configured error threshold for a given period. In dynamic examples, a separate routine is executed to manage the value of the pre-configured error threshold. Thus, as one example, if the manufacture specifies that a DRAM should only correct one error per year, the pre-configured error threshold is set to one for the first year. Upon the expiration of the first year, the pre-configured error threshold can be set to two.

In block 306, the method (300) determines if the leak count is greater than zero.

In one embodiments, the decision in block 306 is a hard decision: if the method (200) determines that a leak likely occurs, the decision in block 306 will result in a restart (block 310).

In block 310, the method (300) restarts the ECU (and DRAM) if the error count is above the pre-configured error threshold or the leak count is greater than zero.

Alternatively, if the leak count is associated with a probability (as described in the description of block 210), the method (300) determines if the number of leaks having a probability greater than a pre-determined leak likelihood threshold is greater than zero. In some embodiments, the method (300) can further analyze the amount of memory leakage associated with the identified memory leaks. In some embodiments, the method (300) will only count those processes leaking memory above a pre-configured maximum leak threshold. In some cases, this pre-configured maximum leak threshold comprises an instantaneous value (i.e., the current leaked memory) while in other cases it may comprise a leak amount over the past four (4) time periods.

While illustrated as sequential operations, the order of blocks 304 and 306 may be reversed or may be executed in parallel.

In block 308, the method (300) enters standby mode if the error count is below (or equal to) the pre-configured error threshold and the leak count is zero. Additionally, the method (300) enters standby mode after a restart (block 310).

As illustrated, if the error count is below the triggering threshold and there were no recognized memory leaks, the method (300) proceeds to honor the standby request and places the system in standby mode.

However, if one or both conditions tested in blocks 304 and 306 are true, the method (300) restarts the device. In the illustrated embodiment, restarting the device comprises fully powering off all components of the device including the DRAM. Since the DRAM is powered off, all memory is lost on the DRAM device and the DRAM is restarted in an initialized state.

Further, as illustrated in FIG. 3, the method (300) immediately enters a standby mode upon restarting. In this scenario, the method (300) deviates from the traditional power on process, by requiring that the device enter standby mode upon powering up. In one embodiment, the device enters standby mode upon reaching a fully powered state. In this scenario, the operating system will be fully loaded and suspended upon reaching that state. Similarly, the DRAM will be initialized as if restarted and suspended in that state pending waking from standby. In this manner, the entire contents of DRAM (including error-prone cells and memory leaking programs) are fully erased from DRAM.

In some embodiments, as part of block 310, the method (300) can take a snapshot of running processes prior to shutting down. Notably, the method (300) does not snapshot the state of these processes (i.e., as would be done a hibernation state) but rather records the programs (and, if possible, the locations of these programs). Upon restarting, the method (300) launches the programs and, upon detecting that the programs have launched, immediately enters standby mode.

Figure 4:
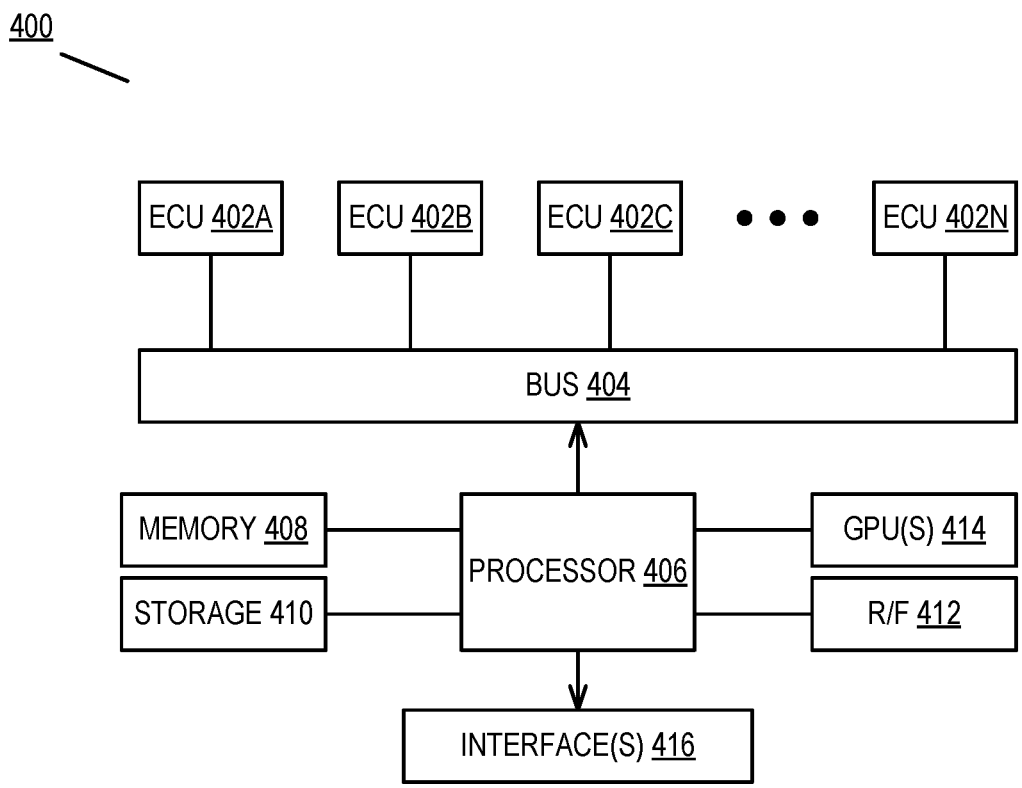
FIG. 4 is a block diagram illustrating a vehicle network according to some embodiments of the disclosure.

FIG. 4 is a block diagram illustrating a vehicle network according to some embodiments of the disclosure.

In FIG. 4, a vehicle (400) can comprise any type of vehicle (e.g., automobile, boat, etc.). Generally, vehicle can comprise any superstructure housing various discrete computing systems and a vehicle is provided as an example. Vehicle (400) includes one or more ECUs (402a-402n). Examples of ECUs include door control unit (DCU), engine control unit, electric power steering control unit (PSCU), human-machine interface (HMI), powertrain control module (PCM), seat control unit, speed control unit (SCU), telematic control unit (TCU), transmission control unit (TCU), brake control module (BCM; ABS or ESC), or battery management system (BMS) devices. While described primarily in the context of ECU devices, any type of embedded computing system may be used in the embodiments disclosed herein and embodiments referencing ECU devices are provided as examples. An exemplary configuration of an ECU is provided in FIG. 5, and that discussion is not repeated herein.

ECUs (402a-402n) are each connected to a bus (404). In some embodiments, the bus (404) comprises a CAN Bus, FlexRay MOST bus, or any other type of bidirectional communication bus.

The processing side of the system includes one or more processors (406), short-term memory (408), an RF system (412), graphics processing units (GPUs) (414), long-term storage (410) and one or more interfaces (418).

The one or more processors (406) may comprise central processing units, FPGAs, or any range of processing devices needed to support the operations of the autonomous vehicle. Memory (408) comprises DRAM or other suitable volatile RAM for temporary storage of data required by processors (406). RF system (412) may comprise a cellular transceiver and/or satellite transceiver. Long-term storage (410) may comprise one or more high-capacity solid-state drives (SSDs). In general, long-term storage (410) may be utilized to store, for example, high-definition maps, routing data, and any other data requiring permanent or semi-permanent storage. GPUs (414) may comprise one more high throughput GPU devices for processing data received from other vehicle subsystems. Finally, interfaces (416) may comprise various display units positioned within the vehicle (e.g., an in-dash screen). In the illustrated embodiment, the memory (408) and/or storage (410) includes pre-booting software configured to execute the methods described previously.

Figure 5:
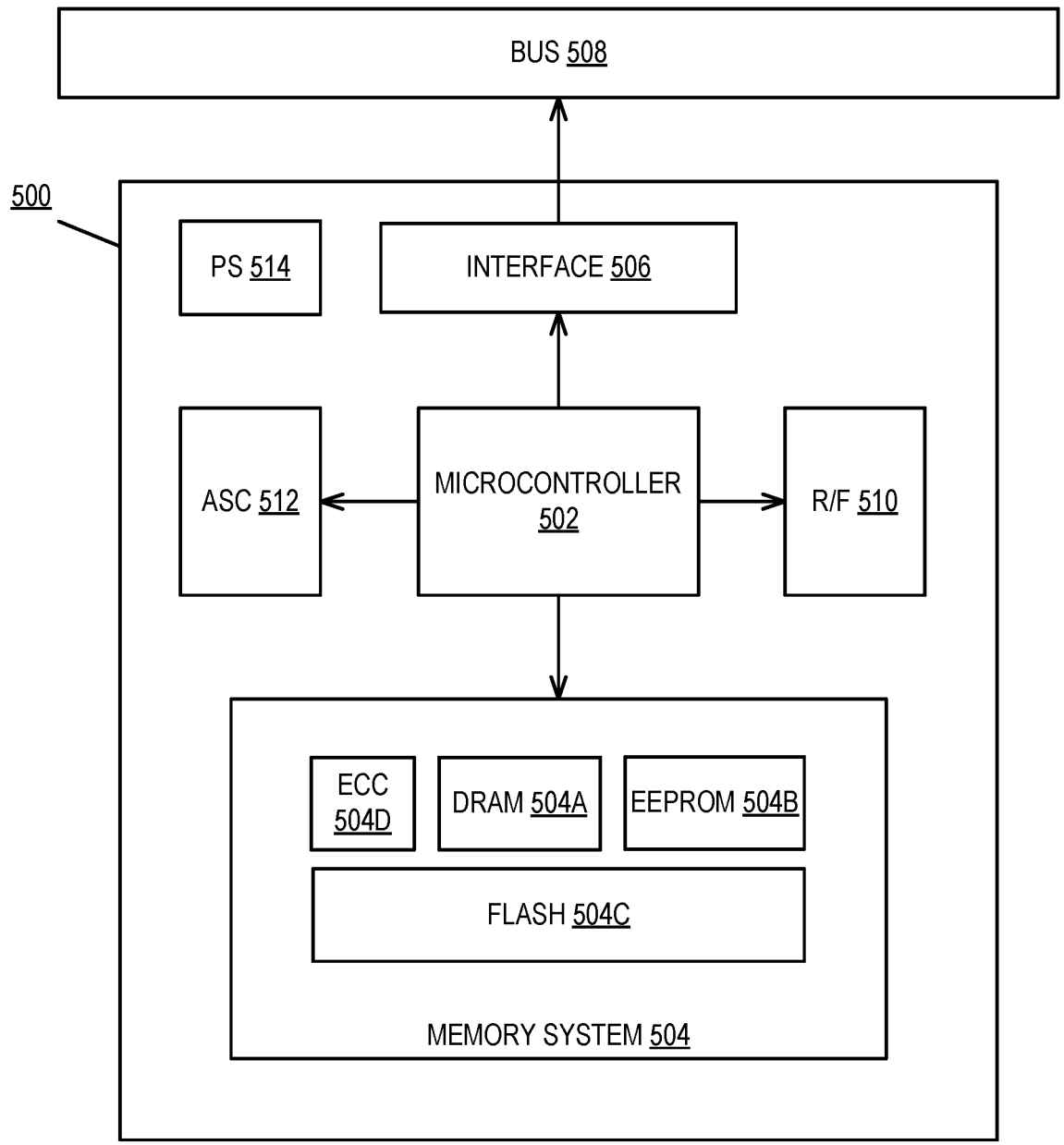
FIG. 5 is a block diagram of an ECU according to some embodiments of the disclosure.

FIG. 5 is a block diagram of an ECU according to some embodiments of the disclosure.

In the illustrated embodiment, an ECU (500) is communicatively coupled to a bus (508) via an interface (506). As discussed above, the bus (508) may comprise a CAN, FlexRay, MOST bus or similar type of bus. Correspondingly, the interface (506) may comprise a similar interface for accessing the specific type of bus used.

The ECU (500) additionally includes a microcontroller (502), R/F subsystem (510), application-specific components (ASC) (512) and memory system (504). In the illustrated embodiment, the microcontroller (502) can comprise a processor or smaller microcontroller configured to control operations of the ECU (500). In some embodiments, the microcontroller (502) accesses program instructions stored in the memory system (504) and, according to those instructions, drives ASC (512). Examples of ASC (512) include actuators for door controls, display units for infotainment ECUs, transmission control devices for TCUs, and various other controls. The types of ASCs employed by the ECU (500) are not limiting and any type of ASCs may be employed by the ECU (500).

ECU (500) additionally includes an R/F system (510). In the illustrated embodiment, the R/F system (510) may include one or more radios or transceivers for communicating with wireless networks. R/F system (510) may include Bluetooth, Wi-Fi or cellular radios or satellite transceivers. In some embodiments, R/F system (510) includes a combination of radios or transceivers. In some embodiments, ECU (500) may not include an R/F system (510) and may instead utilize a vehicle-wide R/F system, as described previously.

Microcontroller (502) manages memory system (504). In the illustrated embodiment, memory system (504) includes DRAM (504a), electrically erasable programmable read-only memory (EEPROM) (504b), Flash storage (504c), and ECC logic (504d).

In the illustrated embodiment, Flash (504c) comprises the primary non-volatile and long-term storage of the ECU (500). Flash (504c) may comprise single-level NAND Flash, multiple-level cell NAND Flash, or any other type of Flash architecture. Alternatively, or in conjunction with the foregoing, Flash (504c) may be replaced or supplemented with hard disk (magnetic) storage. In general, Flash (504c) stores all data used by the ECU (500) including an operating system. The methods (100, 200, 300) may be performed by software included within the operating system or software otherwise stored on Flash (504c). The memory system (504) additionally includes EEPROM (504b) which stores firmware and other infrequently modified data (e.g., boot settings etc.).

Memory system (504) includes DRAM (504a). DRAM (504a) can include any type of DRAM (504a) that provides volatile storage for ECU (500) and the disclosure is not limited to the specific arrangement of DRAM used by DRAM (504a). DRAM (504a) may be coupled to ECC (504d) or ECC (504d) may be embedded within DRAM (504a). ECC (504d) is responsible for performing error correction on any data flagged as corrupt by DRAM (504a). As described above, software in, for example, the operating system in Flash (504c) accesses the DRAM (504a) and/or ECC (504d) to monitor when the ECC (504d) performs error correction. The operating system also periodically receives reports from DRAM (504a) regarding the memory usage of active processes. These statistics are stored in Flash (504c) for later use, as described previously. Further, the operating system receives the initial command to enter standby mode and performs the methods described previously in response to this command.

ECU (500) also includes a power supply (514). In some embodiments, power supply (514) can comprise a power converter that converts a baseband power supply (not depicted) to voltages and currents required by all components of the ECU (500). In some embodiments, power supply (514) may comprise multiple discrete power sources (e.g., external power, battery power, etc.) and may be managed by a power management integrated circuit (PMIC). In the illustrated embodiment, power supply (514) powers each of the components illustrated individually. Further, power supply (514) can be configured to selectively disable and enable power to each component. During standby mode, for example, power supply (514) maintains power to DRAM (504a) while disabling (or lowering) power to all other components. The power supply (514) can be programmatically controlled by the operating system stored within Flash (504c). Specifically, as described above, operating system is configured to instruct the power supply (514) to enter a low-power mode in response to determining that a standby state should be entered. The operating system additionally can instruct power supply (514) to enter a power-off state.

The present disclosure has been described more fully hereinafter with reference to the accompanying drawings, which form a part hereof, and which show, by way of illustration, certain example embodiments. Subject matter may, however, be embodied in a variety of different forms and, therefore, covered or claimed subject matter is intended to be construed as not being limited to any example embodiments set forth herein; example embodiments are provided merely to be illustrative. Likewise, a reasonably broad scope for claimed or covered subject matter is intended. Among other things, for example, subject matter may be embodied as methods, devices, components, or systems. Accordingly, embodiments may, for example, take the form of hardware, software, firmware or any combination thereof (other than software per se). The following detailed description is, therefore, not intended to be taken in a limiting sense.

Throughout the specification and claims, terms may have nuanced meanings suggested or implied in context beyond an explicitly stated meaning. Likewise, the phrase "in one embodiment" as used herein does not necessarily refer to the same embodiment and the phrase "in another embodiment" as used herein does not necessarily refer to a different embodiment. It is intended, for example, that claimed subject matter include combinations of example embodiments in whole or in part.

In general, terminology may be understood at least in part from usage in context. For example, terms, such as "and", "or", or "and/or," as used above may include a variety of meanings that may depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein, depending at least in part upon context, may be used to describe any feature, structure, or characteristic in a singular sense or may be used to describe combinations of features, structures, or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for the existence of additional factors not necessarily expressly described, again, depending at least in part on context.

The present disclosure has been described with reference to block diagrams and operational illustrations of methods and devices. It is understood that each block of the block diagrams or operational illustrations, and combinations of blocks in the block diagrams or operational illustrations, can be implemented by means of analog or digital hardware and computer program instructions. These computer program instructions can be provided to a general-purpose processor, a special-purpose computer, ASIC, or other programmable data processing apparatus, such that the instructions, which execute via the processor of the computer or other programmable data processing apparatus, implement the functions/acts specified in the block diagrams or operational block or blocks. In some alternate implementations, the functions/acts noted in the blocks can occur out of the order noted in the operational illustrations. For example, two blocks shown in succession can in fact be executed substantially concurrently or the blocks can sometimes be executed in the reverse order, depending upon the functionality/acts involved.

For the purposes of this disclosure a computer-readable medium (or computer-readable storage medium/media) stores computer data, which data can include computer program code (or computer-executable instructions) that is executable by a computer, in machine-readable form. By way of example, and not limitation, a computer-readable medium may comprise computer-readable storage media, for tangible or fixed storage of data, or communication media for transient interpretation of code-containing signals. Computer-readable storage media, as used herein, refers to physical or tangible storage (as opposed to signals) and includes without limitation volatile and non-volatile, removable, and non-removable media implemented in any method or technology for the tangible storage of information such as computer-readable instructions, data structures, program modules or other data. Computer-readable storage media includes, but is not limited to, RAM, ROM, EPROM, EEPROM, flash memory or other solid-state memory technology, CD-ROM, DVD, or other optical storage, magnetic cassettes, magnetic tape, magnetic disk storage or other magnetic storage devices, or any other physical or material medium which can be used to tangibly store the desired information or data or instructions and which can be accessed by a computer or processor.

What is claimed is:

1. A method comprising:
recording statistics of a volatile memory by monitoring operations issued to the volatile memory;
detecting a command to enter a standby state;
determining, in response to the command, that a health check should be performed based on the statistics; and
powering down in response to the determining, wherein the powering down causes data stored at the volatile memory to be erased.

2. The method of claim 1, wherein recording statistics of a volatile memory comprises incrementing a count of errors corrected by the volatile memory.

3. The method of claim 1, wherein recording statistics of a volatile memory comprises incrementing a count of memory leaks occurring in the volatile memory.

4. The method of claim 3, wherein incrementing the count of memory leaks occurring in the volatile memory comprises:
receiving a report of memory usages of one or more currently active processes; and
identifying a memory leak if the memory usage of an active process has increased when compared to previously recorded memory usages of the active process.

5. The method of claim 3, wherein determining that the health check should be performed comprises determining if the count of memory leaks is greater than zero.

6. The method of claim 2, wherein determining that the health check should be performed comprises determining if the count of errors is greater than a pre-determined threshold.

7. The method of claim 1, further comprising:
powering up the volatile memory after powering down; and
entering standby mode after powering up.

8. A non-transitory computer readable storage medium for tangibly storing computer program instructions capable of being executed by a computer processor, the computer program instructions defining steps of:
recording statistics of a volatile memory by monitoring operations issued to the volatile memory;
detecting a command to enter a standby state;
determining, in response to the command, that a health check should be performed based on the statistics; and
powering down in response to the determining, wherein the powering down causes data stored at the volatile memory to be erased.

9. The non-transitory computer readable storage medium of claim 8, wherein recording statistics of a volatile memory comprises incrementing a count of errors corrected by the volatile memory.

10. The non-transitory computer readable storage medium of claim 8, wherein recording statistics of a volatile memory comprises incrementing a count of memory leaks occurring in the volatile memory.

11. The non-transitory computer readable storage medium of claim 10, wherein incrementing a count of memory leaks occurring in the volatile memory comprises:
receiving a report of memory usages of one or more currently active processes; and
identifying a memory leak if the memory usage of an active process has increased when compared to previously recorded memory usages of the active process.

12. The non-transitory computer readable storage medium of claim 10, wherein determining that the health check should be performed comprises determining if the count of memory leaks is greater than zero.

13. The non-transitory computer readable storage medium of claim 9, wherein determining that the health check should be performed comprises determining if the count of errors is greater than a pre-determined threshold.

14. The non-transitory computer readable storage medium of claim 8, the computer program instructions further defining the steps of:
powering up the volatile memory after powering down; and
entering standby mode after powering up.

15. A device comprising:
a processor; and
a non-transitory storage medium for tangibly storing thereon program logic for execution by the processor, the stored program logic defining steps of:
recording statistics of a volatile memory by monitoring operations issued to the volatile memory,
detecting a command to enter a standby state,
determining, in response to the command, that a health check should be performed based on the statistics, and
powering down in response to the determining, wherein the powering down causes data stored at the volatile memory to be erased.

16. The device of claim 15, wherein recording statistics of the volatile comprises incrementing a count of errors corrected by the volatile memory.

17. The device of claim 15, wherein recording statistics of the volatile comprises incrementing a count of memory leaks occurring in the volatile memory.

18. The device of claim 17, wherein incrementing a count of memory leaks occurring in the volatile memory comprises:
receiving a report of memory usages of one or more currently active processes; and
identifying a memory leak if the memory usage of an active process has increased when compared to previously recorded memory usages of the active process.

19. The device of claim 17, wherein determining whether the health check should be performed comprises determining if the count of memory leaks is greater than zero.

20. The device of claim 16, wherein determining whether the health check should be performed comprises determining if the count of errors is greater than a pre-determined threshold.

21. The device of claim 15, the stored program logic further defining the steps of:
   powering up the volatile memory after powering down; and
   entering standby mode after powering up.

22. A method comprising:
   periodically recording memory statistics of a volatile dynamic random-access memory (DRAM) in a device, while the device is in a power on state;
   detecting a command to enter a standby state;
   analyzing the memory statistics to determine whether a health check should be performed;
   powering down the device when determining that a health check should be performed; and
   placing the device in standby mode when determining that a health check should not be performed.

23. A device comprising:
   a processor; and
   a storage medium for tangibly storing thereon program logic for execution by the processor, the stored program logic defining the steps of:
   periodically recording memory statistics of a volatile dynamic random-access memory (DRAM) in a device, while the device is in a power on state;
   detecting a command to enter a standby state;
   analyzing the memory statistics to determine whether a health check should be performed;
   powering down the device when determining that a health check should be performed; and
   placing the device in standby mode when determining that a health check should not be performed.

* * * * *